United States Patent [19]
Hilbrink

[11] Patent Number: 5,343,358
[45] Date of Patent: Aug. 30, 1994

[54] APPARATUS FOR COOLING ELECTRONIC DEVICES

[75] Inventor: Johan O. Hilbrink, Cincinnati, Ohio

[73] Assignee: NCR Corporation, Dayton, Ohio

[21] Appl. No.: 51,958

[22] Filed: Apr. 26, 1993

[51] Int. Cl.⁵ .............................................. H05K 7/20
[52] U.S. Cl. ........................... 361/700; 62/259.2; 165/80.4; 165/104.33; 174/15.2; 361/788
[58] Field of Search ............................. 62/259.2, 515; 165/80.3, 80.4, 104.33; 174/15.2; 361/688, 699, 700, 701, 714, 719, 784, 785, 788; 257/714, 715, 723, 724

[56] References Cited

U.S. PATENT DOCUMENTS

| | | |
|---|---|---|
| 3,334,684 | 7/1964 | Roush et al. . |
| 4,155,402 | 5/1979 | Just . |
| 4,183,400 | 1/1980 | Seifert . |
| 4,365,666 | 12/1982 | Seifert . |
| 4,468,717 | 8/1984 | Mathias et al. . |
| 4,493,010 | 1/1985 | Morrison et al. . |
| 4,712,158 | 12/1987 | Kikuchi et al. . |
| 4,733,331 | 3/1988 | Chauvet . |
| 4,777,561 | 10/1988 | Murphy et al. . |
| 4,793,405 | 12/1988 | Diggelmann et al. . |
| 4,873,613 | 10/1989 | Iversen . |
| 4,907,644 | 3/1990 | Ghiraldi . |
| 5,052,472 | 10/1991 | Takahashi et al. . |
| 5,057,968 | 10/1991 | Morrison . |
| 5,095,404 | 3/1992 | Chao ................... 174/15.2 |
| 5,150,274 | 9/1992 | Okada et al. . |
| 5,162,974 | 11/1992 | Currie ................... 361/700 |
| 5,177,666 | 1/1993 | Bland et al. . |
| 5,179,500 | 1/1993 | Koubek et al. . |
| 5,229,915 | 7/1993 | Ishibashi ............. 165/104.33 |

FOREIGN PATENT DOCUMENTS 3246997  11/1991  Japan ................... 124/15.2

Primary Examiner—Gerald P. Tolin
Attorney, Agent, or Firm—Albert L. Sessler, Jr.

[57] ABSTRACT

An arrangement for cooling electronic components in a system. Several circuit boards are connected to a backplane electrically and through heat pipes, which are mounted on the boards and provide connections between the electronic components on the board and the cooling system. The circuit boards, including the attached heat pipes, can be removed from the backplane by detaching electrical connections on the boards from corresponding connectors on the backplane, while at the same time detaching the ends of the heat pipes from sockets in an expander which forms part of the cooling system. If desired, backplanes can be positioned on both sides of the expander, with sockets provided on both sides of the expander to receive end portions of heat pipes.

12 Claims, 6 Drawing Sheets

APPARATUS FOR COOLING ELECTRONIC DEVICES

BACKGROUND OF THE INVENTION

The present invention relates generally to the cooling of electronic devices and more particularly relates to an apparatus and method in which electronic devices which are mounted on a circuit board are cooled from a central system, with a detachable portion of the cooling system being secured to the circuit board and being removable therewith.

Microprocessors made using the CMOS (complementary metal-oxide-semiconductor) process are capable of higher performance when cooled. The performance increment is about ten percent per 25 degrees cooling and has been verified using an NCR Corporation NCR 32000 chip set down to the temperature of liquid nitrogen, 77 degrees Kelvin.

Since it is expected that future microprocessor chips will operate with high power consumption, special provisions must be made for cooling the chips. Commonly, the provisions include the use of heat sinks which provide cooling in an air stream. As the power consumption of the microprocessor chips increases, an alternative to air cooling may prove to be advantageous. Once chip cooling considerations have dictated the use of active cooling, the cooling system can also be used to enhance the performance of the processor.

One potential difficulty in applying an active cooling system to the electronic components on circuit boards of a data processing system is that the structure of such a cooling system may interfere with the convenient removal and replacement of the individual circuit boards of such a system. Since these circuit boards may periodically need to be removed and replaced for repairs, maintenance or other purposes, it would be advantageous to provide an arrangement in which the cooling system structure would not interfere with such removal and replacement.

SUMMARY OF THE INVENTION

In the arrangement of the present invention for cooling components in an electronic system, several processor circuit boards are connected to a backplane electrically and thermally through heat pipes. The heat pipes are attached to the circuit boards and provide effective connections between the components on the boards and the cooling system. The connection of the heat pipes to an expander in the cooling system has the same orientation as the orientation of the electrical connections of the circuit boards to the backplane. The circuit boards, including the attached heat pipes, can be removed from the processor system by pulling the boards and the attached heat pipes out of their respective connectors on the backplane and the expander. Each thermal connector comprises a socket into which the corresponding end of the heat pipe is inserted. The thermal connector may suitably comprise sockets in the component package and in the expander, in each of which an end of the heat pipe may be inserted. The slight space between connector elements may be made more thermally conductive by thermal paste or grease.

It is accordingly an object of the present invention to provide a cooling system for electronic components on circuit boards in which portions of the cooling system may be removed along with the circuit boards in order to facilitate removal and replacement of the circuit boards.

It is another object of the present invention to provide an improved method for cooling electronic components which facilitates the removal and replacement of these components.

Another object is to provide an improved system for cooling of electronic components on a circuit board in which an active cooling system is employed for at least certain of the components while the rest of the board is conventionally cooled by air flow.

Additional benefits and advantages of the present invention will become apparent to those skilled in the art to which this invention relates from the subsequent description of the preferred embodiments and the appended claims, taken in conjunction with the accompanying drawings.

DETAILED DESCRIPTION

Figure 1:
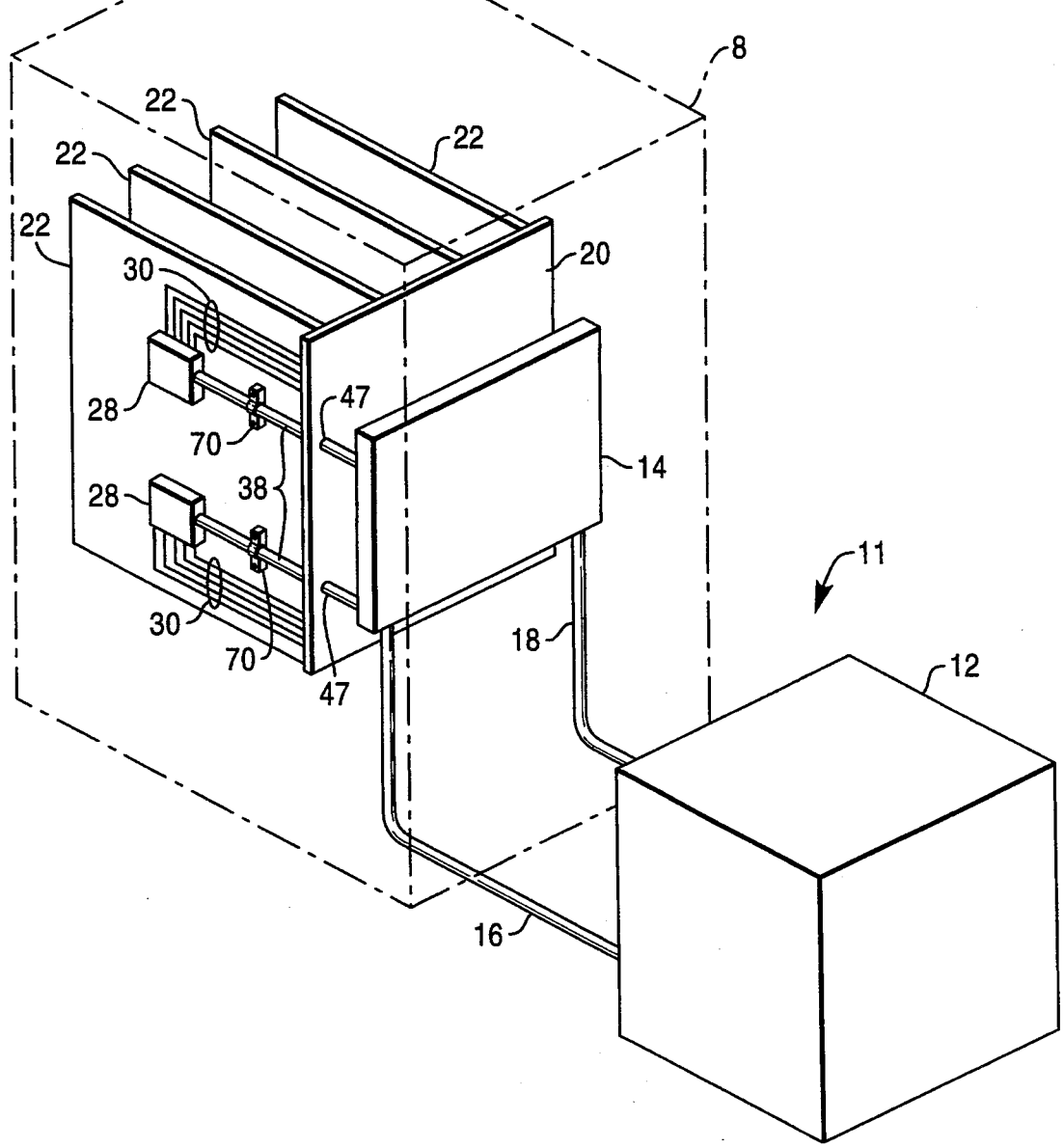
FIG. 1 is a perspective view showing circuit boards and a backplane of an electronic apparatus, with an associated cooling system.

Referring now to FIG. 1, shown there is an electronic apparatus 10, such as a data processing system, which includes a cooling system 11, to enable the electronic components to run at a lower temperature, thereby enhancing their performance. The cooling system 11 includes a compressor 12 which is connected to an expander 14 by suitable piping 16 and 18.

Figure 4:
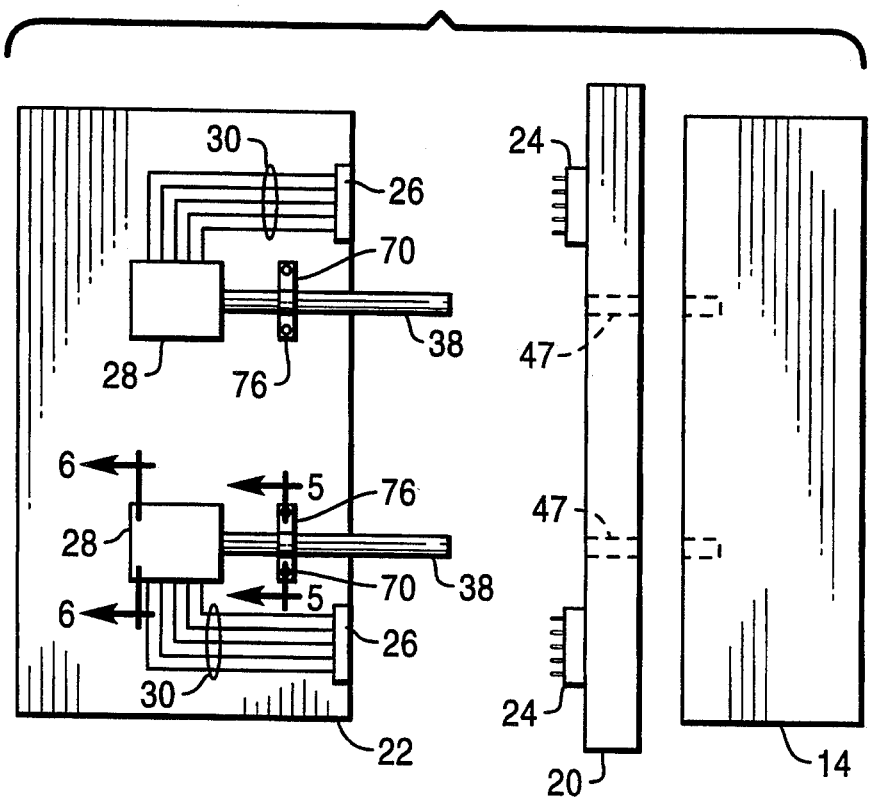
FIG. 4 is an exploded view showing the circuit board with attached semiconductor components and heat pipes separated from the backplane and the expander.

As best shown in FIGS. 1 and 4, the electronic system being cooled may suitably be contained in a housing 8 and includes a support structure such as a backplane 20 and a plurality of printed circuit boards 22 which are attachably attached to the backplane 20 by suitable connectors 24 on the backplane 20 which engage complementary connectors 26 on the circuit boards 22. Each printed circuit board 22 has mounted thereon at least one electronic component 28. Suitable conductors 30, which may be conventionally plated on the surface of the circuit board 22, extend from the component 28 to the connector 26. Electrical signals can thus be transmitted between the components 28 and appropriate electronic components on the backplane 20 through the conductors 30 and the connectors 24 and 26.

Figure 6:
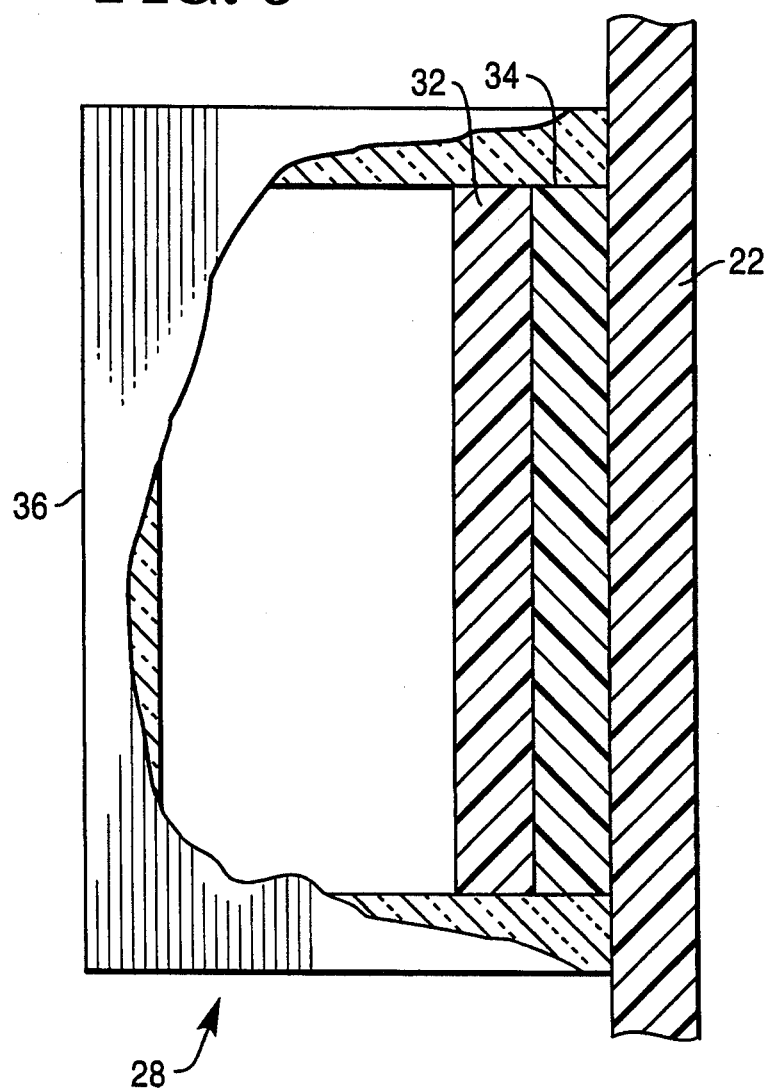
FIG. 6 is a sectional view, taken on line 6—6 of FIG. 4, showing the internal structure of an electronic component package.

Each of the electronic components 28 includes a microelectronic chip in a thermal package, as shown in FIG. 6, in which an integrated circuit 32 is connected to the circuit board 22 by an integrated circuit socket 34. The circuit is surrounded by an insulation package 36. One form of electronic circuit package, together with a method of assembly, is shown in copending U.S. patent application Ser. No. 08/024129, filed Mar. 1, 1993, inventor Johan O. Hilbrink, assigned to the assignee of the present patent application, and incorporated herein by reference.

Each of the electronic components 28 is connected for cooling purposes to the expander 14 of the cooling system 11 by a heat pipe 38. Suitable heat pipes for transferring heat from a device to be cooled to a cooling unit such as an expander are commercially available from many sources at economical cost. One such source is Thermacore Inc., located in Birmingham, Pa., which is a supplier of heat pipes with commercial units available that are capable of transferring heat with an effectiveness of 50 watts per square centimeter of cross-section. The heat pipe 38 may comprise an exterior insulating tube 40 of suitable material such as expanded foam, a tubular housing 42 which may be made of a suitable material such as stainless steel, an annular wick 44 having a central bore 46, which wick may be made of a suitable material such as woven copper mesh, and a working fluid such as ammonia which, in liquid form, travels through the wick 44 from the expander 14 to the electronic component 28, and returns through the central bore 46 in gaseous form to the expander 14 for cooling and liquefaction before continuing its cycle via the wick 44 back to the electronic component 28.

The heat pipes 38 for the various circuit boards 22 extend from the electronic components 28, through apertures 47 in the backplanes 20, to connections to the expander 14. The fit of the heat pipes 38 in the apertures 47 is relatively loose, and the connection of each heat pipe 38 to the expander 14 is readily detachable, to enable the heat pipes 38 to be readily detached from the expander 14 without the use of tools whenever the associated circuit board 22 is removed from the backplane 20 by disconnection of the connectors 24 and 26, for purposes of repair or maintenance. The electrical and cooling connections between the circuit boards 22 and the remainder of the system are thus simultaneously completed and interrupted in a parallel manner.

Figure 2:
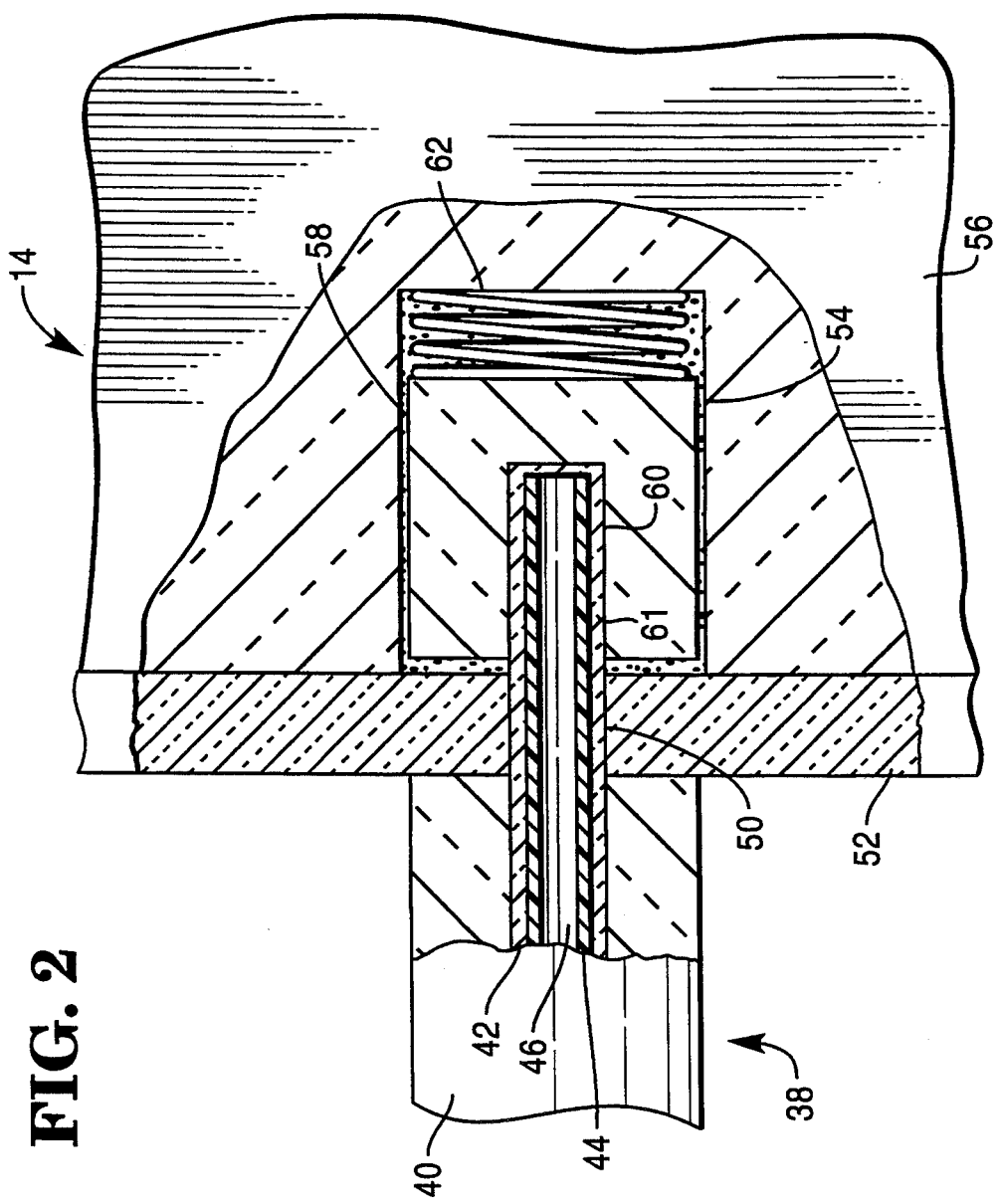
FIG. 2 is a fragmentary sectional view showing the connection of a heat pipe with a cooling system expander.

As may best be seen in FIG. 2, the connection of a heat pipe 38 to the expander 14 includes an aperture 50 in a wall 52 of the expander 14, through which the housing 42 and wick 44 of the heat pipe 38 extend, with sufficient clearance to permit ready removal, into an opening 54 of the body 56 of the expander 14. An expander collet 58 fits somewhat loosely in the opening 54, and includes an internal bore 60 which receives one end of the housing 42 of the heat pipe 38 with sufficient clearance to permit ready removal. The collet 58 is urged against the heat pipe 38 by a coil spring 62 within the opening 54, but is free to move against the spring 62 if necessary in order to accommodate expansion and contraction of the heat pipe 38 in response to temperature changes and to insure intimate contact of heat pipe 38 to electrical component 28. The opening 54 may, if desired, be filled with a thermal grease 61 in order to increase the heat conductivity between the heat pipe 38 and the expander body 56. The heat transfer between collet 58 and expander body 56 is further accommodated by the comparatively large surface area presented by collet 58 to the surface of expander body 56.

Figure 3:
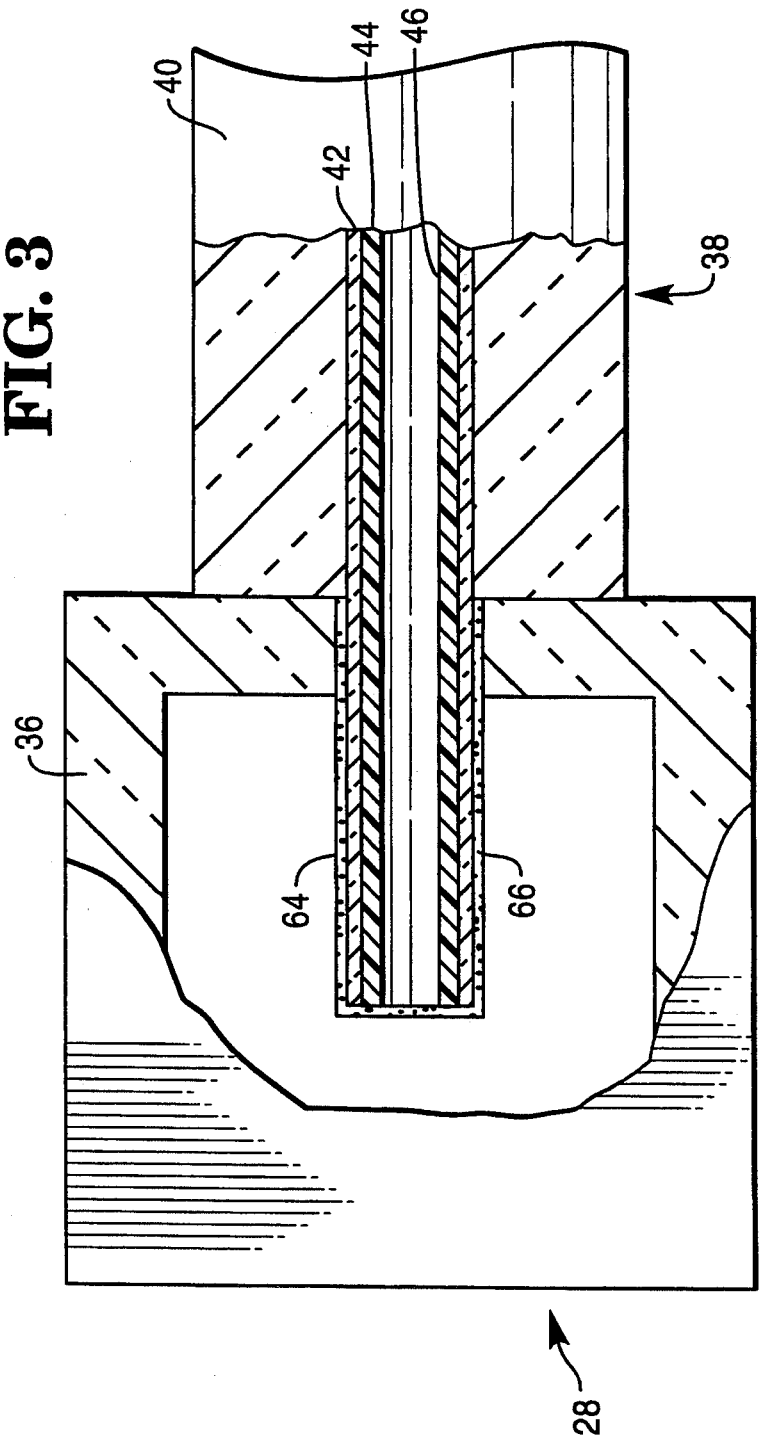
FIG. 3 is a fragmentary sectional view showing the connection of a heat pipe to an electronic component package.

The connection of the other end of the heat pipe 38 to the electronic component 28 is shown in the sectional view of FIG. 3. The insulation package 36 is provided with a cavity 64, in which is disposed an end of the housing 42 of a heat pipe 38. The fit of the housing 42 within the cavity 64 is slightly loose, and thermal grease 66 can be employed within the cavity 64 to provide a solid connection between the heat pipe 38 and the insulating package 36, to enhance thermal conductivity between the two. Spring 62 is used to insure intimate contact between heat pipe 38 and electronic component 28.

Figure 5:
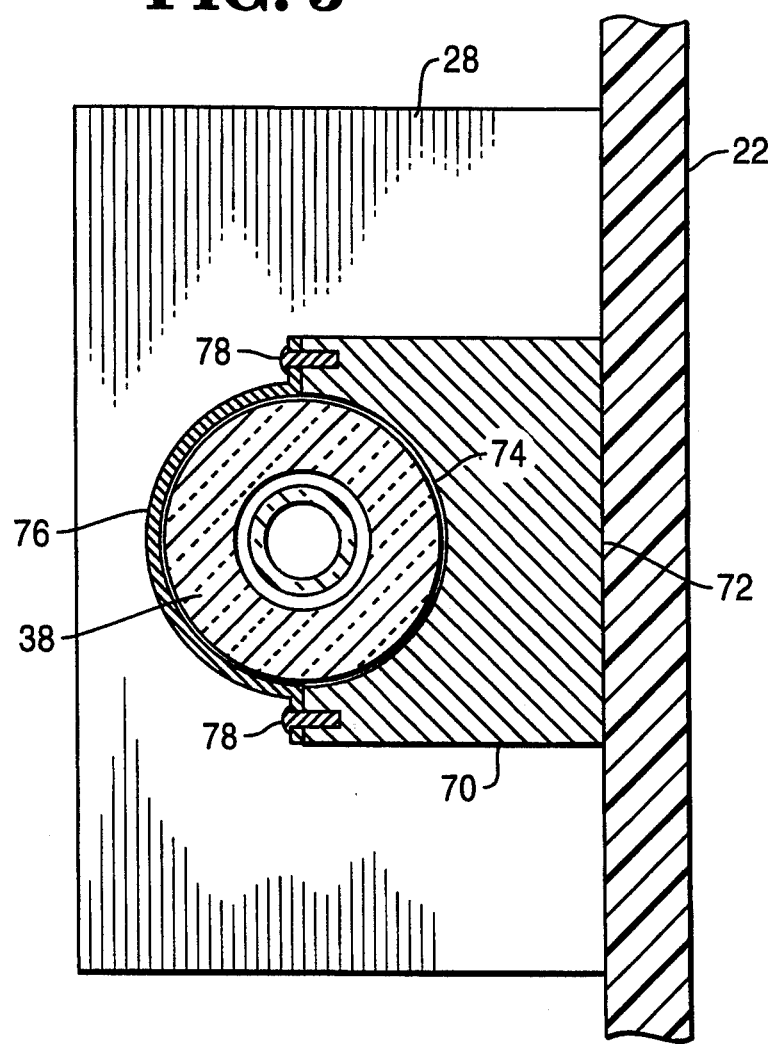
FIG. 5 is a sectional view, taken on line 5—5 of FIG. 4, showing the manner in which a heat pipe is attached to a circuit board.

As best shown in FIG. 5, each of the heat pipes 38 is secured to the circuit boards 22 by at least one support bracket 70 having a base 72 which is fixed to the circuit board 22, and also having a semicircular recess 74 on an opposite side to receive the heat pipe 38. A clamp 76 employed to secure the heat pipe 38 in the recess 74. The clamp 76 is secured in place by fasteners 78.

Figure 7:
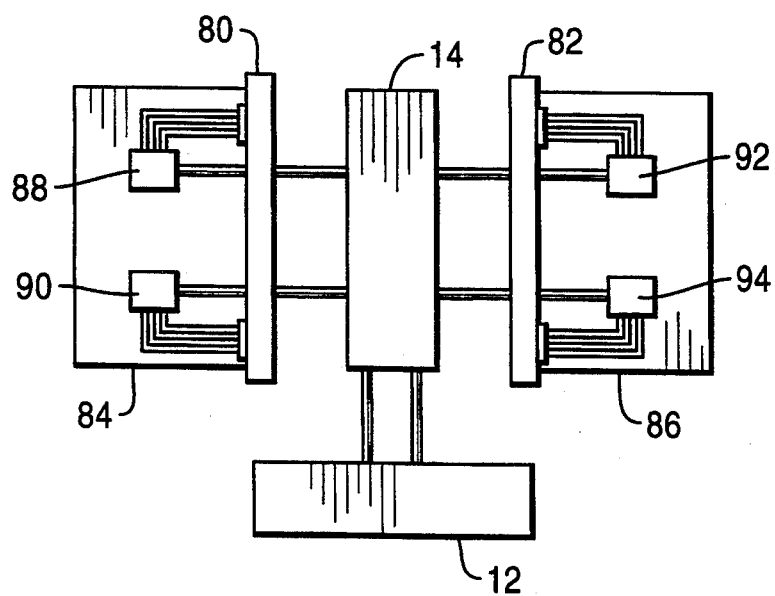
FIG. 7 is an end view of a second embodiment of the invention, showing the combination of an expander of a cooling system with two backplanes located on opposite sides of the expander, and associated circuit boards of an electronic apparatus.

A second embodiment of the invention is shown in FIG. 7. In this embodiment, the cooling apparatus 11, comprising the compressor 12 and the expander 14, are employed to cool the electronic components associated with two different backplanes 80 and 82, which are positioned to either side of the expander 14. At least one circuit board 84 is associated with the backplane 80, and at least one circuit board 86 is associated with the backplane 82. Electronic components 88 and 90 are located on the circuit board 84, and electronic components 92 and 94 are located on the circuit board 86. Conductive paths 96 and heat pipes 98 are associated with each of the electronic components 88, 90, 92 and 94 in the same manner as disclosed above in connection with the embodiment of FIGS. 1-6. The embodiment of FIG. 7 enables the expander 14 to be used with more than one backplane. Indeed, an expander which is extended longitudinally can be connected to multiple backplanes on each side for cooling of the associated electronic components.

Although the invention has been described with particular reference to preferred embodiments thereof, variations and modifications of the present invention can be effected within the spirit and scope of the following claims.

What is claimed is:

1. An electronic assembly, comprising:

an electronic circuit component;

a circuit board on which said electronic circuit component is mounted;

cooling apparatus for providing a cooling medium for cooling said electronic circuit component, said cooling apparatus having a body and a housing surrounding the body, said housing having an aperture therein, said body having a socket coaxial with the aperture and larger than the aperture, a collet positioned within said socket and having an internal axial bore partially therethrough, and a spring positioned within the socket and urging the collet against the housing;

a support structure to which said circuit board is detachably connected; and a heat pipe connected to said electronic component, mounted on said circuit board, and having an end of said heat pipe extending through said housing aperture and into the internal axial bore of said collet, the collet being shiftable within the socket to accommodate movement of the heat pipe which results from temperature-induced expansion and contraction.

2. The electronic assembly of claim 1, in which the heat pipe comprises a cylindrical exterior insulating shell, a tubular housing, an interior cylindrical annular wick having an axial opening therein, and a working fluid.

3. The electronic assembly of claim 2, in which the tubular housing is stainless steel.

4. The electronic assembly of claim 2, in which the working fluid is liquefied by the cooling apparatus and travels through the wick to the electronic component, where it evaporates and traverses the heat pipe back to the cooling apparatus through the axial opening therein.

5. The electronic assembly of claim 1, in which said circuit board has an electrical connector and at least one conductor electrically coupling said electronic component to said electrical connector, and in which said support structure has an electrical connector engaging the electrical connector of the circuit board.

6. The electronic assembly of claim 1, in which the support structure comprises a backplane.

7. The electronic assembly of claim 1, in which the support structure is located between the circuit board and the cooling apparatus, and is apertured to permit the heat transfer element to extend therethrough to engage the cooling apparatus.

8. The electronic assembly of claim 1, in which the electronic component includes an insulating jacket having an internal cylindrical bore and a socket which receives one end of the heat transfer element.

9. The electronic assembly of claim 1, in which the cooling apparatus includes an interconnected compressor and expander, with the heat transfer element being detachably coupled to said expander.

10. The electronic assembly of claim 1, in which the mounting for the heat transfer element on the circuit board comprises a support bracket secured to the circuit board and having a surface recovering the heat transfer element and a clamp clamping the heat transfer element to the support bracket.

11. An artificially cooled electronic assembly, comprising:
    a cooling apparatus, including an expander and a compressor;
    a pair of backplanes, positioned in parallel planes on opposite sides of the expander;
    a circuit board detachably attached in perpendicular relationship to each backplane;
    at least one electronic component mounted on each circuit board; and
    a heat pipe connected to each electronic component, mounted on the circuit board on which the associated electronic component is mounted, and detachably coupled to the expander, whereby each circuit board, with the electronic component and the heat pipe mounted thereon, can be selectively detached from its associated backplane and from the expander.

12. The artificially cooled electronic assembly of claim 11, in which both backplanes include apertures through which the heat pipes mounted on their respective circuit boards pass and are coupled to opposite sides of the expander.

* * * * *

UNITED STATES PATENT AND TRADEMARK OFFICE
CERTIFICATE OF CORRECTION

PATENT NO. : 5,343,358
DATED : August 30, 1994
INVENTOR(S) : Johan O. Hilbrink

It is certified that error appears in the above-indentified patent and that said Letters Patent is hereby corrected as shown below:

Column 6, line 6, "recovering" should be --receiving--.

Signed and Sealed this

Fourth Day of April, 1995

Attest:

BRUCE LEHMAN

Attesting Officer     Commissioner of Patents and Trademarks